United States Patent
Kim et al.

(10) Patent No.: US 11,785,851 B2
(45) Date of Patent: Oct. 10, 2023

(54) THERMOELECTRIC COMPOSITE, AND THERMOELECTRIC ELEMENT AND DEVICE INCLUDING THE SAME

(71) Applicant: Samsung Electronics Co., Ltd., Suwon-si (KR)

(72) Inventors: Jinhong Kim, Seoul (KR); Seyun Kim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 44 days.

(21) Appl. No.: 16/749,357

(22) Filed: Jan. 22, 2020

(65) Prior Publication Data

US 2020/0287116 A1    Sep. 10, 2020

(30) Foreign Application Priority Data

Feb. 1, 2019  (KR) .................. 10-2019-0013756

(51) Int. Cl.
*H10N 10/855* (2023.01)
*H10N 10/17* (2023.01)
*C01B 32/914* (2017.01)

(52) U.S. Cl.
CPC ......... *H10N 10/855* (2023.02); *C01B 32/914* (2017.08); *H10N 10/17* (2023.02)

(58) Field of Classification Search
CPC ....... H01L 35/22; H01L 35/32; C01B 32/914; H10N 10/17; H10N 10/855
See application file for complete search history.

(56) References Cited

U.S. PATENT DOCUMENTS

| | | | |
|---|---|---|---|
| 5,251,981 A | 10/1993 | Kreider | |
| 9,269,882 B2 | 2/2016 | Roh et al. | |
| 9,461,227 B2 | 10/2016 | Kim et al. | |
| 9,580,307 B2 | 2/2017 | Aksit et al. | |
| 2002/0037813 A1* | 3/2002 | Funahashi | C03C 3/15 505/100 |
| 2012/0247524 A1* | 10/2012 | Rolison | H01L 35/22 136/238 |
| 2015/0001989 A1 | 1/2015 | Kim et al. | |
| 2015/0114441 A1 | 4/2015 | Kim et al. | |
| 2015/0380625 A1 | 12/2015 | Freer et al. | |
| 2018/0330843 A1* | 11/2018 | Kozuka | C04B 35/4682 |

FOREIGN PATENT DOCUMENTS

| | | | |
|---|---|---|---|
| JP | 1996-125237 A | 5/1996 | |
| JP | 1996-186294 A | 7/1996 | |
| JP | 5855876 B2 | 12/2015 | |

(Continued)

OTHER PUBLICATIONS

Kim, Jeongmin et al., "Ambipolar thermoelectric power of chemically-exfoliated $RuO_2$ nanosheets", Nanotechnology 29 (Dec. 5, 2017) 015404, 6 pages. (Year: 2017).*

(Continued)

*Primary Examiner* — Tamir Ayad
(74) *Attorney, Agent, or Firm* — CANTOR COLBURN LLP (57) ABSTRACT

A thermoelectric composite includes: a first layer including a thermoelectric semiconductor material; and a second layer including a conductive inorganic filler, wherein the first and second layers are stacked in layered form constituting a superlattice structure.

8 Claims, 9 Drawing Sheets

(56) References Cited

FOREIGN PATENT DOCUMENTS

| JP | 6292664 B2 | 2/2018 |
|---|---|---|
| KR | 1020140065597 A | 5/2014 |
| KR | 1020140103765 A | 8/2014 |
| KR | 1020150087601 A | 7/2015 |
| KR | 1020150119271 A | 10/2015 |
| KR | 10-1625480 B1 | 5/2016 |
| KR | 10-1980194 B1 | 5/2019 |

OTHER PUBLICATIONS

Osada, Minoru et al., "Two-Dimensional Dielectric Nanosheets: Novel Nanoelectronics From Nanocrystal Building Blocks", Adv. Mater. 2012, 24, pp. 210-228. (Year: 2012).*

Tan, Ming, et al., "Enhanced Thermoelectric Properties and Superlattice Structure of a Bi2Te3/ZrB2 film Prepared by Ion-Beam-Assisted Deposition", The Journal of Physical Chemistry, 117, pp. 20415-20420. (Year: 2013).*

Zhu et al., "Compromise and Snergy in High-Efficiency Thermoelectric Materials", Advanced Science News, 2017, 1605884, 1-26.

He et al., "Microstructure—Lattice Thermal Conductivity Correlation in Nanostructured PbTe0.7S0.3 Thermoelectric Materials", Advanced Functional Materials, 20, 2010, 764-772.

Hicks et al., "Effect of quantum-well structures on the thermoelectric figure of merit", Physical Review B, vol. 47, No. 19, May 1993, 47, 12 727-12-731.

Venkatasubramanian et al., "Thin-film thermoelectric devices with high room-temperature figures of merit", Nature, vol. 431, Oct. 2001, 597-602.

Xiao et al., "The Influence of RuO2 Addition on the Thermoelectric Properties of BiSbTe Alloys", Key Engineering Materials, vol. 512-515, 2012, 1651-1654.

Zhao et al., Erratum: Lattice-dynamical calculation of phonon scattering at ideal Si—Ge interfaces, J. Appl. Phys. 97, 2005, 024903.

Korean Office Action for Korean Patent Application No. 10-2019-0013756 dated Jan. 13, 2023.

Liou et al., "Enhanced thermoelectric properties of Sr2Nb2O7 ceramics with barium substitution", Materials Letters, 211, 2018, 270-272.

* cited by examiner

FIG. 11D ed THERMOELECTRIC COMPOSITE, AND
THERMOELECTRIC ELEMENT AND
DEVICE INCLUDING THE SAME

CROSS-REFERENCE TO RELATED APPLICATION

This application claims priority to and the benefit of Korean Patent Application No. 10-2019-0013756, filed on Feb. 1, 2019, in the Korean Intellectual Property Office, and all the benefits accruing therefrom under 35 U.S.C. § 119, the content of which is incorporated herein in its entirety by reference.

BACKGROUND

1. Field

The present disclosure relates to a thermoelectric composite, and a thermoelectric element and a thermoelectric device, each including the thermoelectric composite.

2. Description of the Related Art

The thermoelectric effect is a reversible, direct energy conversion from heat to electricity and vice versa, which occurs when electrons and holes move in a thermoelectric material. The thermoelectric effect includes the Peltier effect, in which heat is generated or absorbed at a junction of two dissimilar materials by a current supplied to the dissimilar materials connected at the junction from the outside; the Seebeck effect, in which an electromotive force is generated by a temperature difference between ends of two dissimilar materials connected at a junction; and the Thomson effect, in which heat is generated or absorbed when a current flows in a material having a temperature gradient.

Currently, thermoelectric materials are used in active cooling systems of semiconductor equipment and electronic devices for which use of a passive cooling system is inefficient. In addition, demand has increased for thermoelectric materials in areas such as precise temperature control systems in DNA applications, where refrigerant gas compression systems are inefficient. Thermoelectric cooling is an environmentally friendly cooling technique, which does not use a refrigerant gas that causes environmental problems, and does not generate vibration or noise. Increased cooling efficiency, e.g., by developing a highly efficient thermoelectric cooling material, would make it possible to extend application of thermoelectric cooling materials to other cooling systems, such as refrigerators and air conditioners. In addition, when a thermoelectric material is applied to a heat dissipation portion of a vehicle engine or an industrial plant, power generation is possible due to a temperature difference between both ends thereof, and thus thermoelectric materials have drawn attention as one of the renewable energy sources. Such thermoelectric power generation systems have already been in operation in space explorers, such as the Mars Probe and Saturn Probe, that cannot use solar energy. Thermoelectric power generation systems, such as those described, above may be used as power sources of flexible or wearable power sources in the future.

Until now, $Bi_2Te_3$, $Sb_2Te_3$, and the like have been the most popular materials used as Peltier cooling materials. Since these materials have a higher dimensionless figure of merit ZT than other materials at around room temperature, extensive research into these materials has been conducted for use in refrigerators, air conditioners, and the like. However, because tellurium (Te) is expensive and because $Bi_2Te_3$ and $Sb_2Te_3$ are easily oxidized, their use is limited. Therefore, there is a need to develop thermoelectric materials which may complement or replace these materials.

SUMMARY

Provided is a thermoelectric composite having improved thermoelectric performance.

Provided is a thermoelectric elements including the thermoelectric composite.

Provided is a thermoelectric modules including the thermoelectric element.

Additional aspects will be set forth in part in the description which follows and, in part, will be apparent from the description, or may be learned by practice of the presented embodiments.

According to an aspect of an embodiment, a thermoelectric composite includes a first layer including a thermoelectric semiconductor material; and a second layer including a conductive inorganic filler, wherein the first and second layers are stacked in a layered form constituting a superlattice structure.

According to an aspect of an embodiment, a thermoelectric element includes the thermoelectric composite.

According to an aspect of an embodiment, a thermoelectric module includes the thermoelectric element.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The embodiments described in the specification and shown in the drawings are only illustrative and are not intended to represent all aspects of the disclosure, such that various equivalents and modifications may be made without departing from the spirit of the disclosure.

All terms used in the disclosure are merely used to describe particular embodiments, and are not intended to limit the disclosure. An expression used in the singular encompasses the expression of the plural, unless it has a clearly different meaning in the context. Hereinafter, it is to be understood that the terms such as "comprises" and/or "comprising," or "includes" and/or "including", "having", or the like are intended to indicate the existence of the features, numbers, steps, operations, components, elements, materials, or combinations thereof disclosed in the specification, and are not intended to preclude the possibility that one or more other features, numbers, steps, operations, components, elements, materials, or combinations thereof may exist or may be added.

In the drawings, thicknesses of layers and regions may be exaggerated for clarity. Like reference numerals in the drawings denote like elements. Throughout the specification, it will also be understood that when an element such as a layer, a region or a substrate is referred to as being "on" another element, it can be directly on the other element, or intervening elements may also be present. It will be understood that, although the terms first, second, and the like may be used herein to describe various components, these components should not be limited by these terms. These terms are only used to distinguish one component from another.

Although the terms first, second, and the like may be used herein to describe various elements, components, regions, layers, and/or sections, these elements, components, regions, layers, and/or sections should not be limited by these terms.

Also, processes described herein are not necessarily performed in an order described herein. For example, it will be understood that, when first and second processes are described, the first process is not necessarily performed before performing the second process.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a thermoelectric composite and a thermoelectric element and a thermoelectric module respectively including the thermoelectric composite will be described in detail.

A thermoelectric composite according to an embodiment includes a first layer including a thermoelectric semiconductor material, and a second layer including a conductive inorganic filler, wherein the first and second layers are stacked in a layered form constituting a superlattice structure.

Performance of thermoelectric materials may be evaluated by using a ZT value, which is referred to as a dimensionless figure of merit, obtained by Equation 1.

$$ZT=(S^2\sigma T)/k \qquad \text{Equation 1}$$

In Equation 1, Z is figure of merit, S is Seebeck coefficient, σ is electrical conductivity, T is absolute temperature, and k is thermal conductivity.

As shown in Equation 1 above, a ZT value of a thermoelectric material may be increased by increasing a Seebeck coefficient and an electrical conductivity and reducing a thermal conductivity. In general, as electrical conductivity increases, a contribution of electrons to thermal conductivity increases, resulting in an increase in the thermal conductivity. According to Equation 1, the figure of merit cannot be increased only by raising electrical conductivity.

Thus, according to an embodiment, while electrical conductivity is increased by forming a composite of a thermoelectric semiconductor material and a highly conductive inorganic filler, thermal conductivity is reduced by inducing phonon scattering at a hetero-junction interface of a superlattice structure formed by stacking a first layer including the thermoelectric semiconductor material and a second layer including the conductive inorganic filler in a layer-by-layer form although the thermal conductivity is increased by the increase in electrical conductivity.

Figure 1:
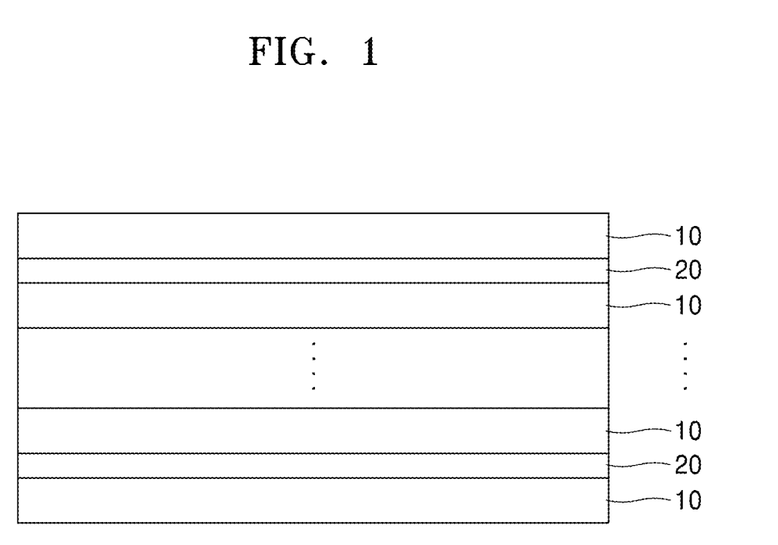
FIG. 1 is a schematic diagram of an embodiment of a thermoelectric composite.

FIG. 1 is a schematic diagram of a thermoelectric composite according to an embodiment.

As shown in FIG. 1, the thermoelectric composite has a superlattice structure formed by stacking a first layer 10 including a thermoelectric semiconductor material and a second layer 20 including a conductive inorganic filler in a layered form. According to an embodiment, the first layer 10 and the second layer 20 may alternately be stacked. However, the embodiment is not limited thereto, and one or more second layers 20 may be inserted between two or more first layers 10.

Figure 4:
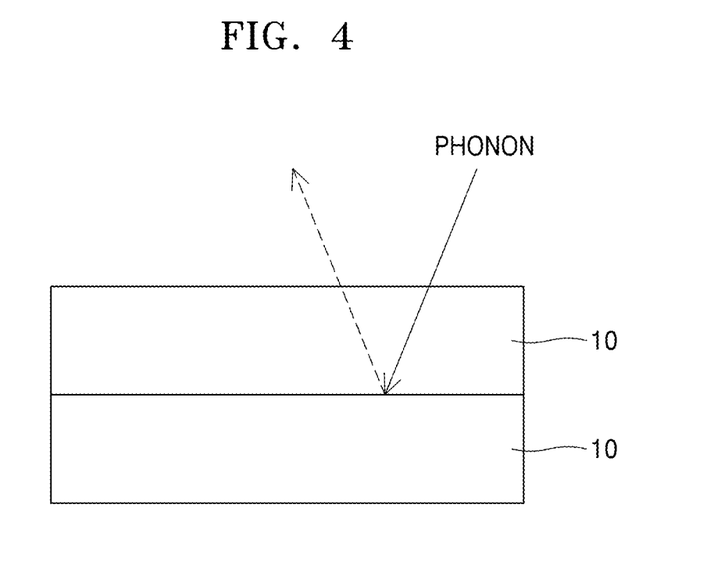
FIG. 4 is a diagram schematically illustrating a phonon scattering phenomenon at a grain boundary of a thermoelectric material formed of a single material.
Figure 5:
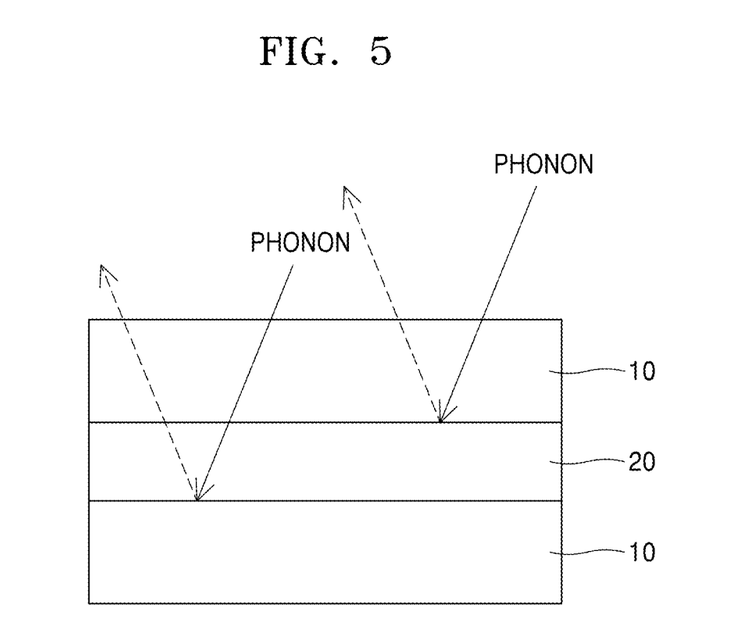
FIG. 5 is a diagram schematically illustrating a phonon scattering phenomenon at a grain boundary and a hetero-junction interface of a hetero-junction structure for describing reduction in thermal conductivity of a thermoelectric composite according to an example embodiment.

When a matrix of a thermoelectric element is formed of only the thermoelectric semiconductor material, heat transfer may be blocked via scattering of a carrier having a given energy, e.g., a phonon, at a grain boundary of the thermoelectric semiconductor material as shown in FIG. 4. On the contrary, when the superlattice structure is formed by stacking the first layer 10 including a thermoelectric semiconductor material and the second layer 20 including a conductive inorganic filler in a layered form, phonons may be scattered not only at grain boundaries of each material but also at a hetero-junction interface formed between different materials, resulting in improvement of heat transfer blocking effect as shown in FIG. 5.

According to an embodiment, the conductive inorganic filler included in the thermoelectric composite may be a filler including a plurality of nanomaterials. For example, the conductive inorganic filler may be in the form of nanosheets, nanorods, or any combination thereof.

Figure 2:
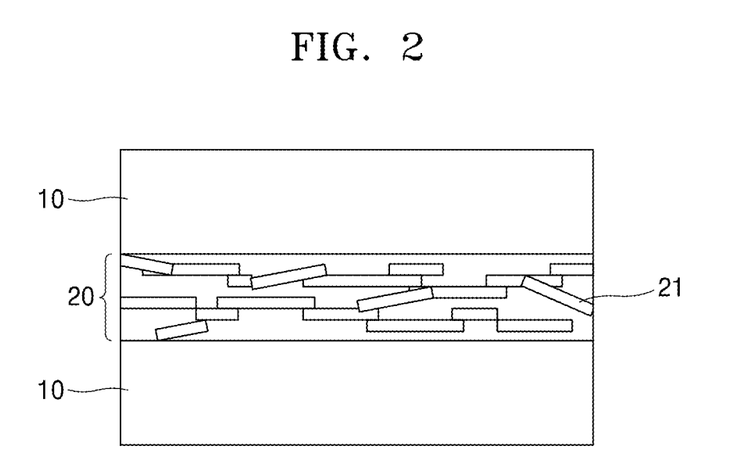
FIG. 2 is a schematic diagram of an embodiment of a thermoelectric composite.

FIG. 2 is a schematic diagram of a thermoelectric composite according to an embodiment. In the thermoelectric composite, the second layer 20 includes a conductive inorganic filler including a plurality of nanomaterials 21.

By using the conductive inorganic filler including the nanomaterials 21, the thermoelectric composite may have an increased Seebeck coefficient by quantum confinement effect. The quantum confinement effect is a concept of increasing the Seebeck coefficient without considerably changing electrical conductivity by increasing an effective mass of a material by increasing a density of states (DOS) of a carrier. According to the quantum confinement effect, offset relationship between the electrical conductivity and the Seebeck coefficient may be collapsed.

Figure 6:
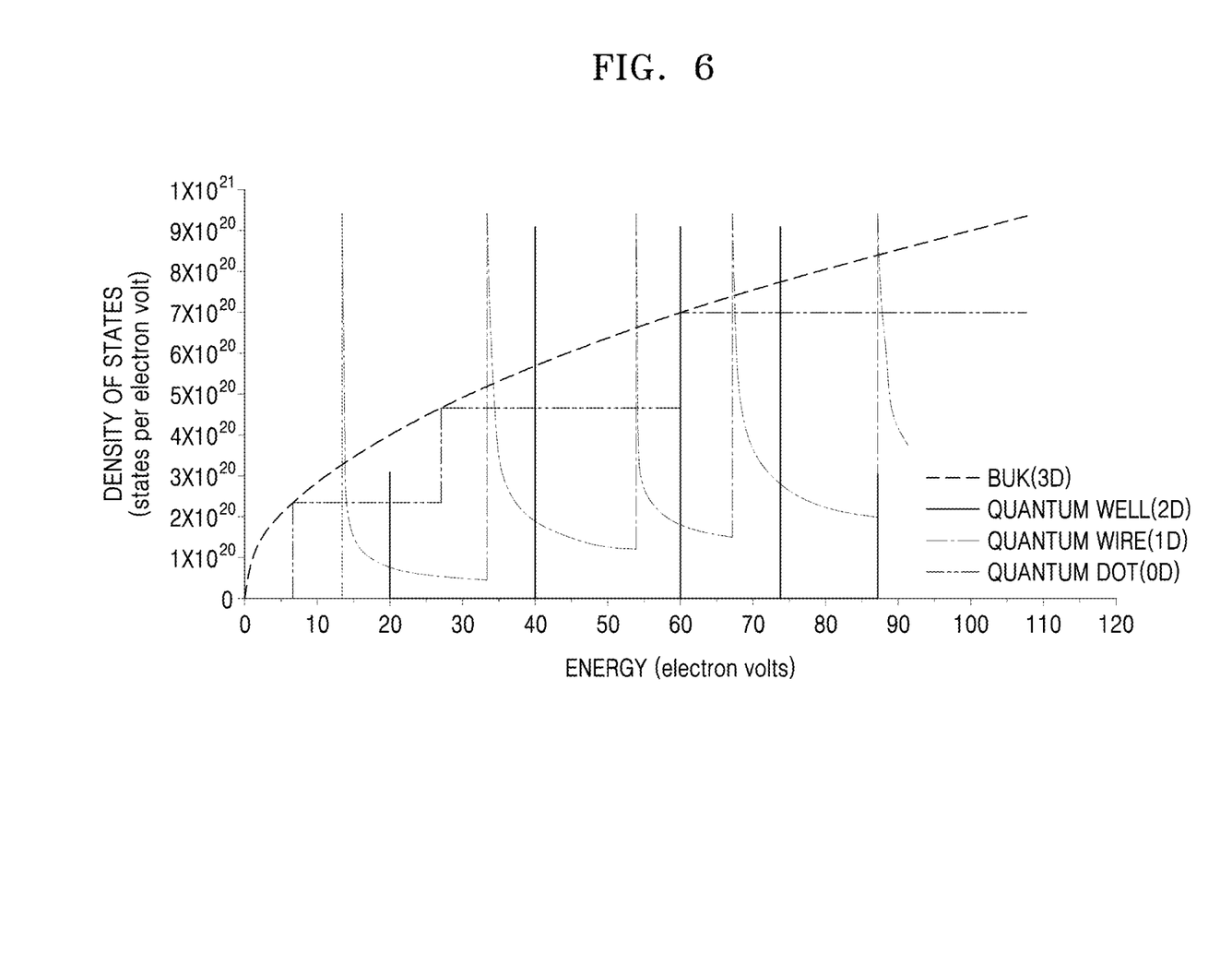
FIG. 6 is a graph of density of states (states per electron volt) versus energy (electron volts) illustrating relationships between energy and density of state (DOS) of a bulk material and nanomaterials.

FIG. 6 is a graph illustrating relationships between energy and DOS of a bulk material and nanomaterials. In FIG. 6, a slope of the DOS with respect to the energy is in proportional to the Seebeck coefficient. Because a wave function of an electrons is more confined from a bulk material (3-dimensional, 3D) to a nanomaterial, e.g., because of the quantum confinement effect, an energy level becomes discontinuous. Thus, a slope increases at a certain energy level, increasing the Seebeck coefficient. Because the thermoelectric composite according to an embodiment includes the conductive inorganic filler including the plurality of nanomaterials 21, the DOS increases at a Fermi level due to 2D and 1D confinements, thereby inducing an increase in the Seebeck coefficient.

According to an embodiment, in the thermoelectric composite, the thermoelectric semiconductor material may have a layered crystal structure.

Figure 3:
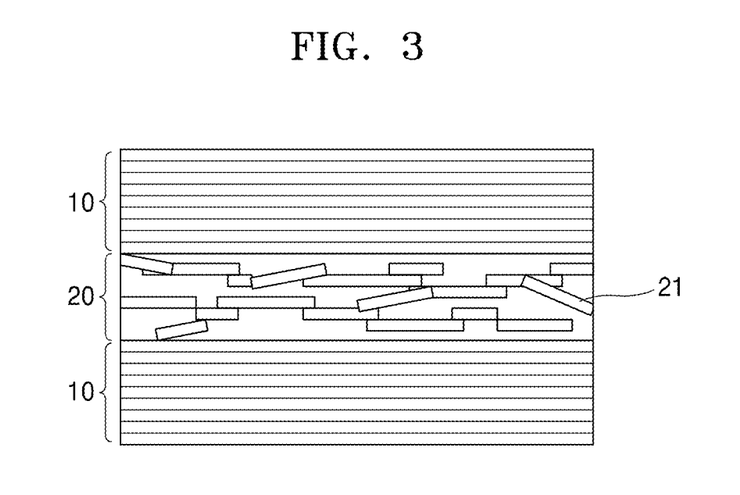
FIG. 3 is a schematic diagram of an embodiment of a thermoelectric composite.

FIG. 3 is a schematic diagram of a thermoelectric composite according to an embodiment. In the thermoelectric composite, the first layer 10 includes a thermoelectric semiconductor material having a layered crystal structure. The thermoelectric semiconductor material having the layered crystal structure may further improve the phonon scattering effect to reduce thermal conductivity. The thermoelectric composite may include the first layer 10 including the thermoelectric semiconductor material having the layered crystal structure and the second layer 20 including the conductive inorganic filler including the plurality of nanomaterials 21.

Hereinafter, the thermoelectric semiconductor material and the conductive inorganic filler available in the thermoelectric composite according to an embodiment will be described in more detail.

The thermoelectric semiconductor material included in the thermoelectric composite may be any suitable material available in the art without limitation, for example, include a thermoelectric semiconductor material selected from a metal element, a transition metal element, a rare earth element, a Group 13 element, a Group 14 element, a Group 15 element, or a Group 16 element. The metal element may be beryllium (Be), magnesium (Mg), calcium (Ca), strontium (Sr), barium (Ba), or the like. The rare earth element may be yttrium (Y), cerium (Ce), lanthanum (La), or the like. The transition metal may include titanium (Ti), zirconium (Zr), hafnium (Hf), vanadium (V), niobium (Nb), tantalum (Ta), chromium (Cr), molybdenum (Mo), tungsten (W), manganese (Mn), iron (Fe), cobalt (Co), nickel (Ni), copper (Cu), zinc (Zn), silver (Ag), rhenium (Re), or a combination thereof. The Group 13 element may include boron (B), aluminum (Al), gallium (Ga), or indium (In). The Group 14 element may include carbon (C), silicon (Si), germanium (Ge), tin (Sn), lead (Pb), or a combination thereof. The Group 15 element may include phosphorus (P), arsenic (As), antimony (Sb), bismuth (Bi), or a combination thereof. The Group 16 element may include sulfur (S), selenium (Se), tellurium (Te), or a combination thereof. For example, any suitable thermoelectric semiconductor material including at least two of the elements described above may be used.

According to an embodiment, the thermoelectric semiconductor material may include any suitable compound containing bismuth (Bi), tellurium (Te), antimony (Sb), selenium (Se), strontium (Sr), barium (Ba), titanium (Ti), niobium (Nb), silicon (Si), germanium (Ge), ruthenium (Ru), indium (In), cadmium (Cd), magnesium (Mg), lead (Pb), iron (Fe), copper (Cu), zinc (Zn), calcium (Ca), or a combination thereof.

Examples of the thermoelectric semiconductor material including the above-described element may be a Bi—Te-based, a Co—Sb-based, a Pb—Te-based, a Ge—Tb-based, a Si—Ge-based, a Sb—Te-based, a Sm—Co-based, or a transition metal silicide-based thermoelectric semiconductor material. These thermoelectric semiconductor materials may improve electrical properties by including, as a dopant, the transition metal, the rare earth element, the Group 13 element, the Group 14 element, the Group 15 element, the Group 16 element, or a combination thereof.

The Bi—Te-based thermoelectric semiconductor material may be a $(Bi_aSb_{1-a})_2(Te_bSe_{1-b})_3$-based thermoelectric semiconductor, wherein $0 \leq a \leq 1$ and $0 \leq b \leq 1$, using Sb and Se as dopants. The Co—Sb-based thermoelectric semiconductor material may be a $CoSb_3$-based thermoelectric semiconductor. The Sb—Te-based thermoelectric semiconductor material may be $AgSbTe_2$ or $CuSbTe_2$. The Pb—Te-based thermoelectric semiconductor material may be PbTe or $(PbTe)_m AgSbTe_2$. According to an embodiment, the Bi—Te-based thermoelectric semiconductor material may be used due to excellent thermoelectric performance at around room temperature.

The thermoelectric semiconductor material may be a p-type or n-type thermoelectric semiconductor material according to the composition of compounds.

For example, the thermoelectric semiconductor material may include $Bi_2Te_{2.79}Se_{0.21}$, $In_4Se_3$, a filled skutterudite (SKD) such as Ga doped $Co_4Sb_{12}$, a lead antimony silver tellrurium compound (LAST), $Mg_2Ge_{0.75}Sn_{0.25}$, $Mg_2Si_{0.3}Sn_{0.7}$, PbTe, PbSe, $Ba_8Ga_{16}Ge_{30}$, $(Hf_{1-a}Zr_a)NiSn$ wherein $0 \leq a \leq 1$, $La_2Te_4$, SiGe, or a combination thereof as the p-type thermoelectric semiconductor material.

For example, the thermoelectric semiconductor material may include MgAgSb, $LaFe_3CoSb_{12}$, a Te-Ag-Ge-Sb-based compound (TAGS), PbSe, PbTe, $Zn_4Sb_3$, BiCuSeO, SnSe, $CuInTe_2$, $Cu_2Se$, FeNbSb, $Si_{0.8}Ge_{0.2}$, $Yb_{14}MnSb_{11}$, or a combination thereof as the n-type thermoelectric semiconductor material.

The thermoelectric semiconductor material may be used in a bulk state or in a particle state having a given size or in an exfoliated layered form or in a laminate of the exfoliated layers.

The thermoelectric semiconductor material may be manufactured by various methods without limitation, for example, using any of the following methods.

A method using an ampoule: this method includes placing a starting material in a quartz tube or metal ampoule, and sealing and heat-treating the quartz tube or metal ampoule in a vacuum.

An arc melting method: this method includes placing a starting material in a chamber and preparing a sample by melting the starting material by arc discharging in an inert gas atmosphere.

A solid-state reaction method: this method includes mixing starting material powder, hardening the mixed powder, and heat-treating thereafter or heat-treating the mixed powder, processing, and sintering thereafter.

A metal flux method: this method includes placing a starting material and an element providing an environment suitable for the starting material to grow a crystal at a high temperature in a crucible, and heat-treating the starting material and the element at a high temperature to grow the crystal.

A Bridgeman's method: this method includes placing a starting material in a crucible, heating an end portion of the crucible at a high temperature until the starting material is melted, and locally melting the sample while slowly moving a high-temperature region to allow the entire sample to pass through the high-temperature region, thereby growing a crystal.

A zone melting method: this method includes preparing a starting material in the form of a seed rod and a feed rod, locally melting the sample at a high temperature, and slowing moving the melted portion upward to grow a crystal.

A vapor transport method: this method includes adding a starting material to a bottom of a quartz tube and heating the bottom of the quartz tube where the starting material is positioned while a top of the quartz tube is left open to stay at a lower temperature such that a crystal is grown as the starting material is vaporized.

A mechanical alloying method: this method includes adding starting material powder and a steel ball to a cemented carbide jar and rotating the jar to form an alloy by allowing the ball to mechanically impact the starting material powder.

After preparing the thermoelectric semiconductor in a bulk according to the above-described method, the thermoelectric semiconductor may be classified into predetermined ranges according to average diameters for use by using a mechanical sieve.

To stack the first layer including the thermoelectric semiconductor material in a two-dimensional layered form, the thermoelectric semiconductor material may be processed by using an exfoliating agent such as TBAOH, a chemical synthesis method, or a mechanical exfoliation method. The first layer may have a structure in which several layers of the thermoelectric semiconductor material are stacked.

According to an embodiment, the thermoelectric semiconductor material may include a metal oxide having a layered crystal structure.

According to an embodiment, the metal oxide having the layered crystal structure may be represented by Formula 1.

$$A^{11}_{(n-m-1)}A^{12}_{m}M_nO_{(3n+1)} \qquad \text{Formula 1}$$

In Formula 1, $A^{11}$ and $A^{12}$ each independently include at least one metal element having a valance of +2 or +3, wherein $A^{12}$ has a greater ionic radius than that of $A^{11}$, M includes Nb, V, Ta, Ti, Zr, Hf, W, Mo, Cr, Pb, Sn, or a combination thereof, and n≥3 and m>0 are satisfied.

A two-dimensional layered structure is formed by the metal elements positioned in "A site," wherein "site" refers to a crystallographic site, summing $A^{11}$ site and $A^{12}$ site and in "M site" together with oxygen atoms of Formula 1. Accordingly, the metal oxide may have a layered crystal structure due to the two-dimensional layer.

In each of the $A^{11}$ site and $A^{12}$ site, a metal element having a valance of +2 or +3, such as, an alkaline-earth metal element, Pb, La, Ce, Pr, Sm, Eu, Gd, Tb, Dy, Ho, Er, Tm, Yb, Lu or a combination thereof, may be positioned. However, different metal elements are positioned in the $A^{11}$ site and $A^{12}$ site of Formula 1. That is, the metal element positioned in the A11 site may have a different "ionic radius when ionized to +2 or +3 valence" from the metal element positioned in the $A^{12}$ site.

The metal element positioned in the $A^{12}$ site may have a greater ionic radius than the metal element positioned in the $A^{11}$ site. When metal elements satisfying the ionic radius conditions are positioned in the $A^{11}$ site and the $A^{12}$ site, the metal oxide having improved relative permittivity may be provided.

In Formula 1, $A^{11}$ may include, for example, Be, Mg, Ca, Sr, Ra, Pb, La, Ce, Pr, Sm, Eu, Gd, Tb, Dy, Ho, Er, Tm, Yb, Lu, or a combination thereof.

In Formula 1, $A^{12}$ may be, for example, Ba Pb, or a combination thereof.

The metal oxide may be represented by Formula 2.

$$A^{21}_{(2-m)}A^{22}_{m}M'_3O_{10} \qquad \text{Formula 2}$$

In Formula 2, $A^{21}$ and $A^{22}$ each independently include Be, Mg, Ca, Sr, Ba, Ra, Pb, La, Ce, Pr, Sm, Eu, Gd, Tb, Dy, Ho, Er, Tm, Yb, Lu, or a combination thereof, wherein $A^{22}$ has a greater ionic radius than that of $A^{21}$, M' includes Nb, V, Ta, Ti, Zr, Hf, W, Mo, Cr, Pb, Sn, or a combination thereof, and 0<m≤1 is satisfied.

The metal oxide may be represented by Formula 2a.

$$A^{21}_{(n-m-1)}Ba_mM_nO_{(3n+1)} \qquad \text{Formula 2a}$$

In Formula 2a, M is the same as in Formula 1 above, $A^{21}$ includes Be, Mg, Ca, Sr, Ra, Pb, La, Ce, Pr, Sm, Eu, Gd, Tb, Dy, Ho, Er, Tm, Yb, Lu, or a combination thereof, and n≥3 and 0<m≤1 are satisfied.

In Formula 2a, Ba is positioned in the $A^{12}$ site of Formula 1, and a metal element having a smaller ionic radius than that of $Ba^{2+}$ when ionized to +2 or +3 valance, for example, an alkaline-earth metal element except Ba, Pb, Ra, Pb, La, Ce, Pr, Sm, Eu, Gd, Tb, Dy, Ho, Er, Tm, Yb, Lu, or a combination thereof may be positioned in the $A^{21}$ site.

In addition, a molar ratio of the metal elements positioned in the $A^{21}$ site to Ba may be, in the range of about 1:1 to about 10:1, for example, about 1:1 to about 9:1, about 1:1 to about 8:1, about 1:1 to about 7:1, about 1:1 to about 6:1, or about 1:1 to about 5:1. That is, the mole number of the metal elements positioned in the $A^{21}$ site may be equal to or greater than that of Ba.

Accordingly, the metal oxide may have a two-dimensional crystal structure of $A^{21}_{(n-m-1)}Ba_mM_nO_{(3n+1)}$ in which the A site is mainly occupied by the metal elements positioned in the $A^{21}$ site, and the other regions of the A site except the $A^{21}$ site are substituted with Ba.

Alternatively, the metal oxide may be represented by Formula 2b.

$$Sr_{(n-m-1)}A^{32}_{m}M_nO_{(3n+1)} \qquad \text{Formula 2b}$$

In Formula 2b, M is the same as in Formula 1 above, and $A^{32}$ includes Ba Pb, or a combination thereof, and n≥3 and 0<m≤1 are satisfied.

In Formula 2b, Sr is positioned in the $A^{11}$ site of Formula 1, and an element having a greater ionic radius than that of $Sr^{2+}$ when ionized to +2 or +3 valance, and selected from, for example, Ba Pb, or a combination thereof may be positioned in the $A^{32}$ site.

A molar ratio of Sr to the metal element positioned in the $A^{32}$ site may be determined such that the mole number of Sr is greater than the mole number of the metal element positioned in the $A^{32}$ site as described above with reference to Formula 2a. Accordingly, the metal oxide may have a two-dimensional crystal structure of $Sr_{(n-m-1)}A^{32}{}_mM_nO_{(3n+1)}$ in which the A site is mainly occupied by Sr and the other regions of the A site are substituted with the element positioned in the $A^{32}$ site.

According to an embodiment, the metal oxide may include $Sr_{(2-m)}Ba_mNb_3O_{10}$ (where $0<m\leq1$).

In the thermoelectric composite, the first layer may further include a nanostructure in addition to the thermoelectric semiconductor material. For example, the nanostructure may include one or more one-dimensional and/or two-dimensional nanostructures selected from nanoplates, nanodiscs, nanosheets, nanowires, nanofibers, nanobelts, nanotubes, nanocrystals, and nanopowder. These nanostructures may be introduced into an interface of the thermoelectric semiconductor material of the thermoelectric element to effectively scatter phonons, thereby increasing the Seebeck coefficient and reducing thermal conductivity of the thermoelectric element.

In the thermoelectric composite, the second layer may include the conductive inorganic filler.

Because the conductive inorganic filler and the thermoelectric semiconductor material are alternately stacked in a layer-by-layer form, the first layer including a thermoelectric semiconductor material and the second layer including a conductive inorganic filler may constitute a superlattice structure.

The conductive inorganic filler may be a filler including a plurality of nanomaterials. For example, the conductive inorganic filler may be in the form of nanosheets, nanorods, or any combination thereof. The filler in the form of nanosheets and nanorods may include nanosheets or nanorods of various materials, respectively. The nanosheets or the nanorods may have a given electrical conductivity (e.g., 1250 s/m). However, the electrical conductivity of the nanosheets and the nanorods may be slightly less or greater than the given electrical conductivity.

In the second layer, the nanomaterials of the conductive inorganic filler may electrically be connected by surface contact and/or line contact at some regions, thereby forming a conductive network.

The nanomaterial of the conductive inorganic filler may have a thickness of about 1 nanometer (nm) to about 1,000 nm. The nanomaterial of the conductive inorganic filler may have a length of about 0.1 micrometer (µm) to about 500 µm. When the thickness and the length of the nanomaterials of the conductive inorganic filler 20 are within the ranges above, a conductive network may be formed, with a small amount, at an interface between the thermoelectric semiconductor materials 10.

The filler in the form of nanosheets or nanorods may include one or more of an oxide, a boride, a carbide, and a chalcogenide.

The oxide used as the conductive inorganic filler may be, for example, $RuO_2$, $MnO_2$, $ReO_2$, $VO_2$, $OsO_2$, $TaO_2$, $IrO_2$, $NbO_2$, $WO_2$, $GaO_2$, $MoO_2$, $InO_2$, $CrO_2$, $RhO_2$ or a combination thereof.

The boride used as the conductive inorganic filler may be, for example, $Ta_3B_4$, $Nb_3B_4$, $TaB$, $NbB$, $V_3B_4$, $VB$, or a combination thereof.

The carbide used as the conductive inorganic filler may be, for example, $Dy_2C$, $Ho_2C$, or a combination thereof.

The chalcogenide used as the conductive inorganic filler may be, for example, $AuTe_2$, $PdTe_2$, $PtTe_2$, $YTe_3$, $CuTe_2$, $NiTe_2$, $IrTe_2$, $PrTe_3$, $NdTe_3$, $SmTe_3$, $GdTe_3$, $TbTe_3$, $DyTe_3$, $HoTe_3$, $ErTe_3$, $CeTe_3$, $LaTe_3$, $TiSe_2$, $TiTe_2$, $ZrTe_2$, $HfTe_2$, $TaSe_2$, $TaTe_2$, $TiS_2$, $NbS_2$, $TaS_2$, $Hf_3Te_2$, $VSe_2$, $VTe_2$, $NbTe_2$, $LaTe_2$, $CeTe_2$, or a combination thereof.

According to an embodiment, the conductive inorganic filler in the oxide form may include a ruthenium oxide nanosheet of the formula $RuO_{(2+x)}$ wherein $0\leq x<0.1$ and may be prepared according to the following method. Oxide-based inorganic fillers may be prepared in a similar or the same process to the manufacturing process of a ruthenium oxide nanosheet of the formula $RuO_{(2+x)}$ wherein $0\leq x<0.1$.

$RuO_{(2+x)}$ nanosheets are prepared as follows. First, $K_2CO_3$ and $RuO_2$ are mixed in a molar ratio of 5:8 and pelletized and the pellets are added to an alumina crucible and heat-treated in a tube furnace at a temperature of 850° C. for 12 hours. This heat treatment may be performed in a nitrogen atmosphere. A weight of the pellets may be in the range of about 1 gram (g) to about 20 g but may vary as needed. For example, the pellets may be in the form of discs.

After the heat treatment, the temperature of the furnace is decreased to room temperature, the alumina crucible is taken out of the furnace, and the pellets are taken out of the alumina crucible and pulverized to obtain powder.

Subsequently, the powder is washed with about 100 milliliter (mL) to about 4 liter (L) of water for 24 hours and filtered to obtain powder. The obtained powder has a composition of $K_{0.2}RuO_{2.1}\cdot nH_2O$.

Then, the $K_{0.2}RuO_{2.1}\cdot nH_2O$ powder is added to a 1 molar (M) HCl solution, stirred for 3 days, and filtered to obtain powder. The obtained powder has a composition of $H_{0.2}RuO_{2.1}$.

Next, 1 g of the $H_{0.2}RuO_{2.1}$ powder is added to 250 mL of an aqueous solution containing an intercalant such as tetramethylammonium hydroxide (TMAOH) and tetrabutylammonium hydroxide (TBAOH) and the solution is stirred for more than 10 days. In this regard, concentrations of TMAOH and TBAOH may be set such that $TMA^+/H^+$ and $TBA^+/H^+$ are in the range of about 0.1 to about 50, respectively. After completion of the stirring process, the solution is centrifuged. This centrifugation may be performed at 2000 revolutions per minute (rpm) for 30 minutes. By this centrifugation, the solution is separated into an aqueous solution including exfoliated $RuO_{(2+x)}$ nanosheets and precipitates including non-exfoliated powder thereof.

A concentration of the aqueous solution including the exfoliated $RuO_2$ nanosheets obtained by the centrifugation is measured by using an ultraviolet-visible spectrophotometer (UVS).

Subsequently, light absorbance of the $RuO_2$ nanosheet-containing aqueous solution is measured at a wavelength of 350 nm, and a concentration of $RuO_2$ nanosheets in the $RuO_2$ nanosheet-containing aqueous solution is calculated by using an absorption coefficient of the $RuO_2$ nanosheet (7400 L/mol•cm).

Then, a volume of the $RuO_2$ nanosheet-containing aqueous solution is measured such that a desired weight of the $RuO_2$ nanosheet is included therein and a solvent is removed from the $RuO_2$ nanosheet-containing aqueous solution by centrifugation. In this case, a centrifuge may be operated at 10,000 rpm or higher for 15 minutes or more.

Also, chalcogenide nanosheets may be prepared according to the following method.

Starting materials are prepared in the form of solid phase powder. In this regard, the starting materials are prepared by measuring weights to fit an atomic ratio. Subsequently, the prepared starting materials are uniformly mixed and then pelletized. The prepared pellets are added to a quartz tube and the quartz tube is filled with argon (Ar) gas and sealed. The quartz tube containing the pellets is placed in a furnace and heat-treated at a temperature of about 500° C. to about 1300° C. for about 12 hours to about 72 hours. After the heat treatment, a heat-treated product is cooled to room temperature and the pellets contained in the quartz tube are taken out and pulverized to obtain powder. Then, lithium (Li) ions are injected between chalcogenide layers in the form of powder. The lithium ions may be injected between the chalcogenide layers by using a lithium ion source, e.g., n-butyllithium.

According to an embodiment, lithium ions may directly be injected between the chalcogenide layers in the form of powder by using an electrochemical method instead of using the lithium ion source.

When lithium ions are injected between the chalcogenide layers in the form of powder, gaps between the chalcogenide layers widen. Therefore, the chalcogenide layers, i.e., chalcogenide nanosheets, may easily be exfoliated. By replacing the lithium ions with larger molecules (such as water molecules or any suitable organic molecules), gaps between the chalcogenide layers further widen. Accordingly, the chalcogenide nanosheets may more easily be exfoliated.

The chalcogenide nanosheets may also be exfoliated easily according to another suitable method. The chalcogenide may be ultrasonicated after injecting the lithium ions between the chalcogenide layers in the form of powder.

Boride nanosheets may be prepared according to the following two methods.

As a first method, the boride nanosheets may be prepared in the same manner as the preparation of the chalcogenide nanosheets.

A second method is as follows.

Starting materials are prepared in the form of solid phase powder. In this regard, the starting materials are prepared by measuring weights to fit an atomic ratio. Subsequently, the prepared starting materials are uniformly mixed and then pelletized. The prepared pellets are added to an arc melting device and melted at high temperature using an arc. This process using the arc may be repeated several times until the pellets are uniformly mixed to form a single phase. Subsequently, after cooling the resultant to room temperature, the resultant is taken out of the device and pulverized to obtain a powder. Lithium ions are injected between boride layers in the form of powder. The lithium ions may be injected between the boride layers of powder by using a lithium ion source, e.g., n-butyllithium. The lithium ions may also be injected directly between the boride layers in the form of powder by using an electrochemical method instead of using the lithium ion source. When lithium ions are injected between the boride layers in the form of powder, gaps between the boride layers widen. Therefore, the boride layers, i.e., boride nanosheets, may easily be exfoliated. By replacing the lithium ions with larger molecules (such as water molecules or suitable organic molecules), gaps between the boride layers further widen. Accordingly, the boride nanosheets may more easily be exfoliated.

The boride nanosheets may also be exfoliated by ultrasonicating the boride after injecting lithium ions between the boride layers in the form of powder.

Carbide nanosheets may be prepared according to the above-described method of preparing the boride nanosheets.

The conductive inorganic filler in the form of nanorods may be prepared according to any suitable method in the art.

In the thermoelectric composite, an amount of the conductive inorganic filler may be in the range of about 0.01 volume percent (vol %) to about 50 vol %, for example, about 0.1 vol% to about 25 vol %, particularly, about 0.1 vol % to about 10 vol %, about 0.1 vol % to about 5 vol %, or about 1 vol % to about 2 vol % based on a total volume of the thermoelectric semiconductor material and the conductive inorganic filler. Within the amount ranges described above, the second layer including the conductive inorganic filler may be stacked between the first layers including the thermoelectric semiconductor material, thereby forming a hetero-junction interface to effectively increasing phonon scattering.

The amount of the conductive inorganic filler may vary according to electrical conductivity of the conductive inorganic filler. For example, when an inorganic filler having a high electrical conductivity is used, the electrical conductivity of the thermoelectric composite may be increased only with a small amount of the inorganic filler. For example, when the conductive inorganic filler including $RuO_2$ having a high electrical conductivity is used, a thermoelectric composite having excellent electrical conductivity may be prepared by using 5 vol % or less of the conductive inorganic filler based on the total volume of the thermoelectric semiconductor material and the conductive inorganic filler.

The conductive inorganic filler and the thermoelectric semiconductor material may alternately be stacked in a layer-by-layer form allowing the first layer including a thermoelectric semiconductor material and the second layer including a conductive inorganic filler to constitute the superlattice structure. In the second layer, the nanomaterials of the conductive inorganic filler are electrically connected via surface contact and/or line contact at some regions, and thus a conductive network may be formed therein. The thermoelectric composite hybridized by the conductive inorganic filler forming the conductive network may have a higher electrical conductivity. When the conductive inorganic filler does not aggregate but constitutes the superlattice structure in which the first layer and the second layer are alternately stacked and nanomaterials included in the conductive inorganic filler are in surface contact and/or line contact with each other, the phonon scattering effect may be improved and the electrical conductivity may be increased, and thus the figure of merit of the thermoelectric element may further be increased.

The second layer may further include a nanostructure in addition to the conductive inorganic filler. For example, the nanostructure may include one or more one-dimensional and/or two-dimensional nanostructures selected from nanoplates, nanodiscs, nanowires, nanofibers, nanobelts, nanotubes, nanocrystals, and nanopowder. These nanostructures may be introduced into an interface of the conductive inorganic filler of the thermoelectric element to effectively scatter the phonons, thereby increasing the Seebeck coefficient and reducing thermal conductivity of the thermoelectric element.

Because the thermoelectric composite has the superlattice structure in which the thermoelectric semiconductor material and the conductive inorganic filler are stacked in a layer-by-layer form, the thermoelectric composite may have a considerably increased Seebeck coefficient and dimensionless figure of merit ZT in comparison with the thermoelectric semiconductor material. The Seebeck coefficient of the thermoelectric composite may be in the range of about 10 microvolts per kelvin ($\mu V/K$) to about 20000 $\mu V/K$. Also, the thermoelectric composite may have a dimensionless figure of merit ZT value of about 0.001 to about 10. This ZT value is far greater than that of the thermoelectric semiconductor material in a bulk state and also greater than a simple composite of a thermoelectric semiconductor material and a conductive inorganic filler in the form of general particles.

The thermoelectric composite may be prepared by using a physical method, for example, ultrasonic degradation. That is, a thermoelectric composite may be prepared by adding a basic thermoelectric material having a layered crystal structure and a conductive inorganic filler to a solvent such as water or ethanol, and ultrasonicating the solution. If required, an exfoliating agent such as TBAOH may be added thereto to increase efficiency.

According to an embodiment, a thermoelectric element including the thermoelectric composite is provided.

The thermoelectric element may be a p-type thermoelectric element or an n-type thermoelectric element according to the thermoelectric semiconductor material used therein. Also, the thermoelectric element may be formed in a predetermined shape, for example, a rectangular parallelepiped shape.

The thermoelectric element may be prepared by sintering under a pressure by using a spark plasma sintering method. Using such a spark plasma sintering method, a thermoelectric element in a bulk state may be obtained.

The thermoelectric element may be formed into a predetermined shape, for example, a rectangular parallelepiped shape, by a cutting process and the like and applied to a thermoelectric module.

The thermoelectric element may be coupled with an electrode, exhibiting a cooling effect by applying a current or a power generating effect due to a temperature difference of the element.

According to an embodiment, a thermoelectric module including a first electrode, a second electrode, and the thermoelectric element positioned between the first electrode and the second electrode is provided.

The thermoelectric module may be configured to absorb or generate heat at opposite ends of the thermoelectric element by a current supplied between the first electrode and the second electrode or configured to generate a current via the thermoelectric element when there is a temperature difference between the first electrode and the second electrode. In the thermoelectric module, a first end of the thermoelectric element is in contact with the first electrode and a second end of the thermoelectric element is in contact with the second electrode. When a temperature of the first electrode is increased to be higher than that of the second electrode or when the temperature of the second electrode is decreased to be lower than that of the first electrode, a current flowing from the first electrode to the thermoelectric element and passing through the thermoelectric element to the second electrode may be generated. When the thermoelectric module is in operation, the first electrode may electrically be connected to the second electrode.

In addition, the thermoelectric module may further include a third electrode and a thermoelectric element interposed between the first electrode and the third electrode.

For example, the thermoelectric module may include a first electrode, a second electrode, a third electrode, a p-type thermoelectric element including a first end and a second end, and an n-type third electrode including a first end and a second end, wherein the first end of the p-type thermoelectric element is in contact with the first electrode, the second end of the p-type thermoelectric element is in contact with the third electrode, the first end of the n-type thermoelectric element is in contact with the first electrode, and the second end of the n-type thermoelectric element is in contact with the second electrode. Thus, when the temperature of the first electrode is higher than those of the second electrode and the third electrode, a current flowing from the second electrode to the n-type thermoelectric element, passing through the n-type thermoelectric element to the first electrode, passing through the first electrode to a p-type thermoelectric element, and passing through the p-type thermoelectric element to the third electrode may be generated. When the thermoelectric module is in operation, the second electrode may electrically be connected to the third electrode. At least one of the p-type thermoelectric element and the n-type thermoelectric element includes a thermoelectric material containing a three-dimensional nanostructure.

The thermoelectric module may further include an insulating substrate on which at least one of the first electrode and the second electrode, selectively the third electrode is arranged.

The insulating substrate may be a gallium arsenide (GaAs), sapphire, silicon, Pyrex, or quartz substrate. The electrode may include any material selected from aluminum, nickel, gold, and titanium and may have any selected size. The electrode may be patterned by using any suitable known method without limitation, for example, a lift-off semiconductor process, a deposition method, or a photolithography method.

Figure 7:
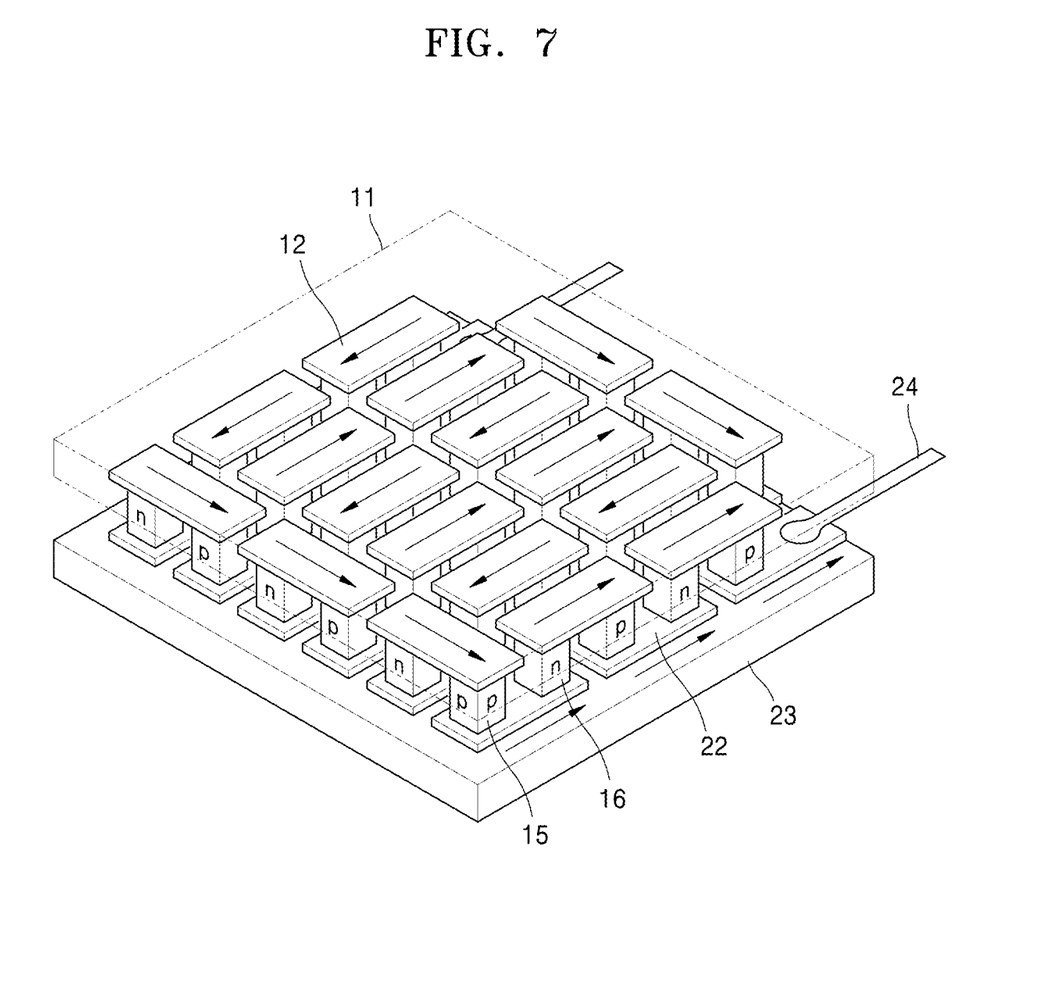
FIG. 7 is a perspective view of a thermoelectric module according to an embodiment.

FIG. 7 is a perspective view of a thermoelectric module including the thermoelectric element. As illustrated in FIG. 7, an upper electrode 12 and a lower electrode 22 are patterned respectively on an upper insulating substrate 11 and a lower insulating substrate 23, and a p-type thermoelectric element 15 and an n-type thermoelectric element 16 contact both of the upper electrodes 12 and the lower electrode 22, respectively. The upper and lower electrodes 12 and 22 are electrically connected to the outside of the thermoelectric element via a lead electrode 24.

In the thermoelectric module, the p-type thermoelectric element and the n-type thermoelectric element may be arranged alternately as shown in FIG. 7, and at least one of the p-type thermoelectric element and the n-type thermoelectric element may include the thermoelectric composite.

In the thermoelectric module, one of the first electrode and the second electrode may electrically be connected to a power supply. A temperature difference between the first electrode and the second electrode may be about 1 degree or more, about 5 degrees or more, about 50 degrees or more, about 100 degrees or more, or about 200 degrees or more. The temperature of each electrode may be any suitable temperature as long as dissolution of any component of the thermoelectric module or current interference is not caused thereby.

Figure 8:
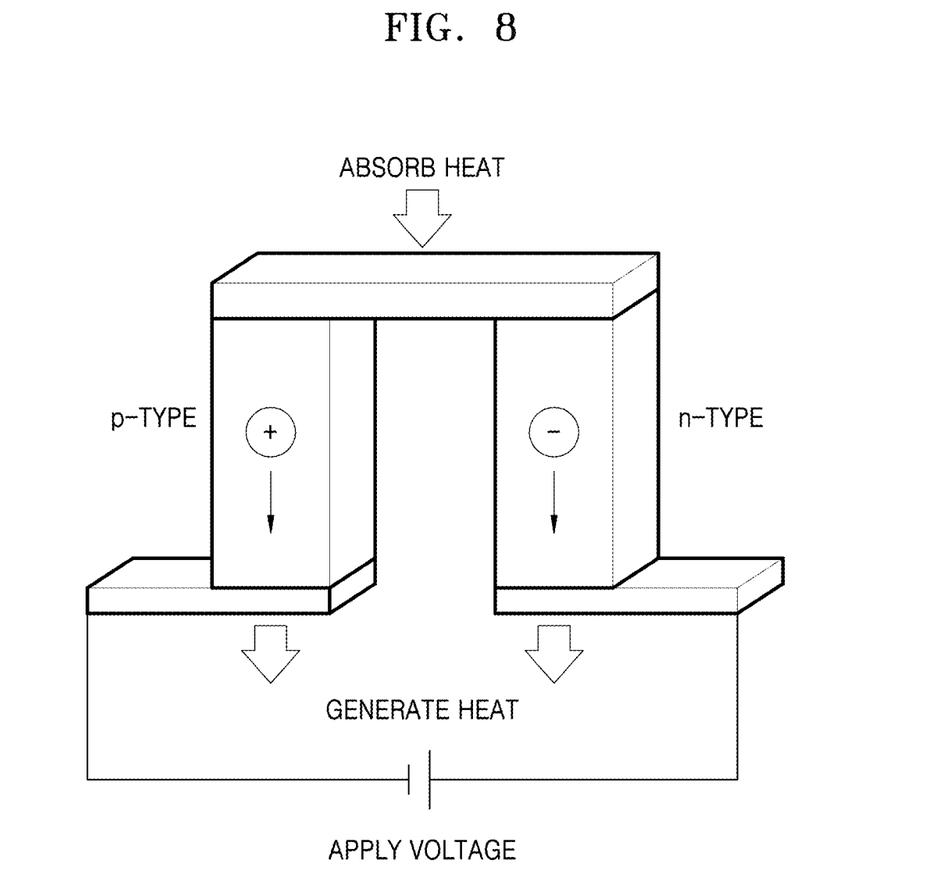
FIG. 8 is a schematic diagram of a thermoelectric module according to an embodiment showing thermoelectric cooling by the Peltier effect.
Figure 9:
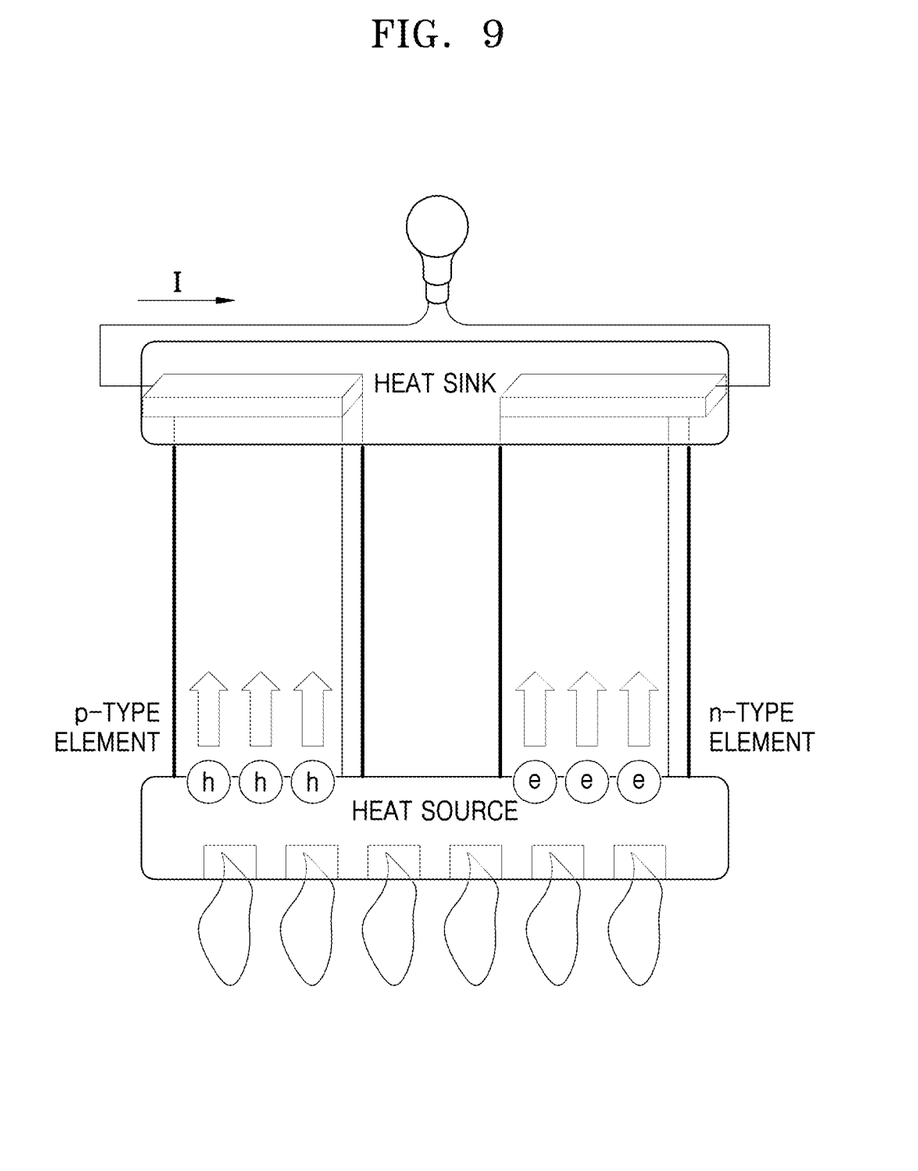
FIG. 9 is a schematic diagram of a thermoelectric module according to an embodiment showing thermoelectric power generation by the Seebeck effect.

As another example of the thermoelectric module, thermoelectric modules respectively including a first electrode, a second electrode, and the above-described thermoelectric element interposed between the first electrode and the second electrode are shown in FIGS. 8 and 9. The thermoelectric modules may further include an insulating substrate on which at least of the first electrode and the second electrode is arranged as illustrated in FIG. 7. The insulating substrate may be the same as the insulating substrate described above.

As illustrated in FIG. 8, the first electrode and the second electrode of the thermoelectric module according to an embodiment may electrically be connected to a power supply. An externally applied DC voltage may move holes of the p-type thermoelectric element and electrons of the n-type thermoelectric element to generate or absorb heat at opposite ends of the thermoelectric elements.

As shown in FIG. 9, at least one of the first electrode and the second electrode of the thermoelectric module may be exposed to a heat source according to an embodiment. Upon receiving heat from an external heat source, electrons and holes move to generate a current flow in the thermoelectric element, thereby causing power generation.

In the thermoelectric module according to an embodiment, the p-type thermoelectric element and the n-type thermoelectric element may alternately be arranged, and at least one of the p-type thermoelectric element and the n-type thermoelectric element may include the thermoelectric composite.

According to an embodiment, a thermoelectric device including a heat source and the thermoelectric module may be provided. The thermoelectric module may absorb heat from the heat source and may include the thermoelectric element, the first electrode, and the second electrode, wherein the second electrode may be arranged to face the first electrode. One of the first electrode and the second electrode may be in contact with the thermoelectric element.

The thermoelectric device according to an embodiment may further include a power supply electrically connected to both of the first electrode and the second electrode. The thermoelectric device according to an embodiment may further include an electrical device electrically connected to one of the first electrode and the second electrode.

The thermoelectric composite, the thermoelectric element, the thermoelectric module, and the thermoelectric device may be applied to, for example, thermoelectric cooling systems and thermoelectric power generation systems. The thermoelectric cooling systems may be micro cooling systems, general-use cooling devices, air conditioners, waste heat power generation systems, and the like, without being limited thereto. Configurations and manufacturing methods of the thermoelectric cooling systems are well known in the art, and thus detailed descriptions thereof will not be given herein.

EXAMPLES

Hereinafter, the present disclosure will be described in more detail according to the following examples and comparative examples. However, the following examples are merely presented to exemplify the present disclosure, and the scope of the present disclosure is not limited thereto.

Example 1

2 g of $Sr_{1.8}Ba_{0.2}Nb_3O_{10}$ (hereinafter, referred to as 'SBNO') and 0.2 g of $RuO_2$ nanosheet were added to 50 ml of water together with 0.35 g of a TBAOH exfoliating agent, followed by ultrasonication to form a thermoelectric composite. The thermoelectric composite was dried and sintered at 600° C. for 5 minutes by spark plasma sintering.

Comparative Example 1

2 g of SBNO was added to 50 ml of water together with 0.35 g of a TBAOH exfoliating agent, followed by ultrasonication to form a thermoelectric material. The thermoelectric material was dried and sintered at 600° C. for 5 minutes by spark plasma sintering.

Comparative Example 2

2 g of SBNO and 0.2 g of $RuO_2$ nanoparticles were added to 50 ml of water together with 0.35 g of an exfoliating agent, followed by ultrasonication to form a thermoelectric composite. The thermoelectric composite was dried and sintered at 600° C. for 5 minutes by spark plasma sintering.

Evaluation Example 1

Transmission Electron Microscope (TEM) Analysis

Figure 10:
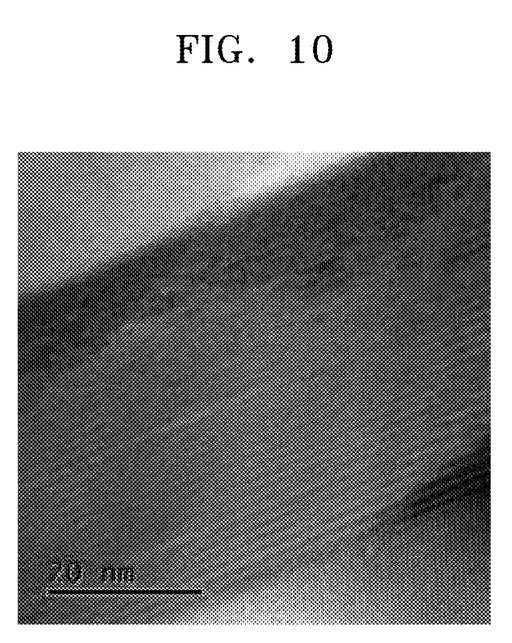
FIG. 10 is a transmission electron microscope (TEM) analysis result of a thermoelectric material prepared according to Comparative Example 1.

The thermoelectric material prepared according to Comparative Example 1 and the thermoelectric composite prepared according to Example 1 were analyzed using a transmission electron microscope (TEM), and the results are shown in FIGS. 10 and 11, respectively.

Figure 11A:
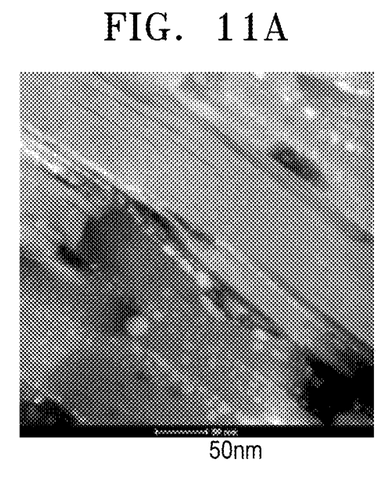
FIGS. 11A to 11D are a TEM images showing the results of TEM analysis of a thermoelectric composite prepared according to Example 1.
Figure 11B:
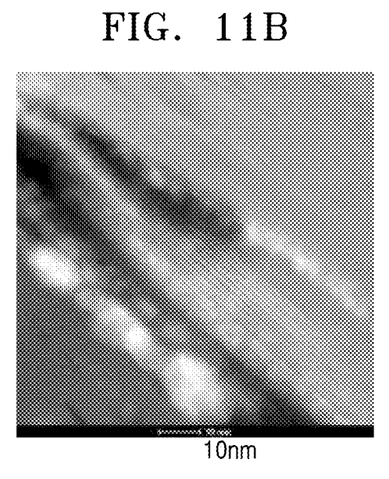
Figure 11C:
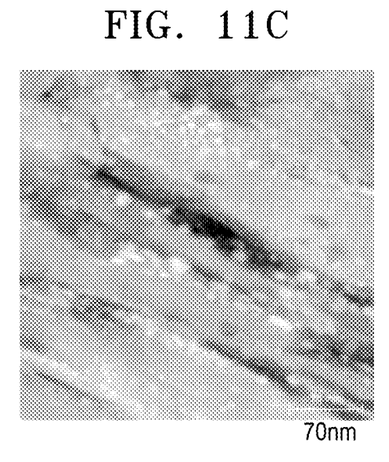
Figure 11D:
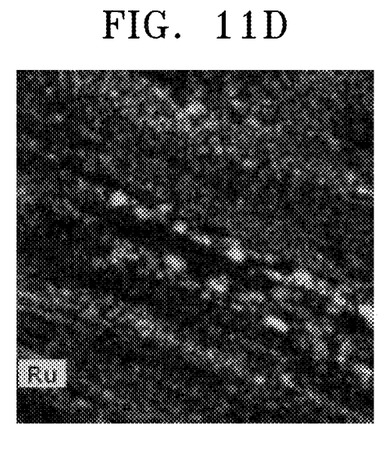

As shown in FIG. 10, it may be confirmed that the SBNO thermoelectric semiconductor, used as a base material of the thermoelectric composite, has a layered crystal structure. As shown in FIGS. 11A to D, it may be confirmed that the thermoelectric composite prepared according to Example 1 has a superlattice structure in which the SBNO thermoelectric semiconductor material and the $RuO_2$ nanosheets are stacked in a layer-by-layer form. FIG. 11B shows an enlarged view of a portion showing FIG. 11A which illustrates a layer-by-layer form of the $RuO_2$ nanosheet.

Evaluation Example 2

Measurement of Thermoelectric Performance

An energy conversion efficiency of a thermoelectric material is expressed by a dimensionless figure of merit ZT represented by Equation 1.

$$ZT = \frac{S^2 \sigma T}{\kappa} \quad \text{Equation 1}$$

In Equation 1, ZT is figure of merit, S is Seebeck coefficient, σ is electrical conductivity, T is absolute temperature, and κ is thermal conductivity.

To evaluate thermoelectric performance of the thermoelectric composite and the thermoelectric material respectively prepared according to Example 1 and Comparative Example 1 and 2, the dimensionless figure of merit ZT including the Seebeck coefficient S, the electrical conductivity σ, and the thermal conductivity κ was evaluated at room temperature.

The Seebeck coefficient and the electrical conductivity were measured by the van der Pauw method using a ZEM-3 manufactured by ULVAC-RIKO, and the thermal conductivity was evaluated by measuring thermal diffusivity using the Angstrom method. The dimensionless figure of merit was calculated using the measured values.

Measurement results of the Seebeck coefficient S, the electrical conductivity σ, and the thermal conductivity κ of the thermoelectric composite and thermoelectric material respectively prepared according to Example 1 and Comparative Examples 1 and 2 and the dimensionless figure of merit ZT calculated therefrom are shown in Table 1.

TABLE 1

|  | Example 1 SBNO + $RuO_2$ (nanosheets) | Comparative Example 1 SBNO | Comparative Example 2 SBNO + $RuO_2$ (nanoparticles) |
| --- | --- | --- | --- |
| ZT | $4.0 \times 10^{-3}$ | $2.0 \times 10^{-5}$ | $1.0 \times 10^{-5}$ |
| Electrical conductivity (S/cm) | $5 \times 10^{-4}$ | $5 \times 10^{-5}$ | $5 \times 10^{-5}$ |

TABLE 1-continued

| | Example 1 SBNO + RuO$_2$ (nanosheets) | Comparative Example 1 SBNO | Comparative Example 2 SBNO + RuO$_2$ (nanoparticles) |
|---|---|---|---|
| Thermal conductivity (W/m-K) | 0.83 | 1.26 | 0.84 |
| Seebeck coefficient (μV/K) | 14700 | 4030 | 2050 |

As shown in Table 1, the figure of merit ZT of the thermoelectric composite according to Example 1 was about 200 times greater than that of the SBNO base material which does not form a composite with RuO$_2$ nanosheets. Particularly, the electrical conductivity of the thermoelectric composite according to Example 1 was about 10 times greater than that of the SBNO base material due to formation of hetero-junction interfaces. The thermal conductivity of the thermoelectric composite according to Example 1 was about 1.5 times less than that of the SBNO base material due to an increase in phonon scattering by formation of a boundary at the hetero-junction interface. The Seebeck coefficient of the thermoelectric composition according to Example 1 was about 3.6 times greater than that of the SBNO base material due to an increase in DOS by using the 2D RuO$_2$ nanosheets.

Also, the figure of merit ZT of the thermoelectric composite prepared according to Comparative Example 2 including RuO$_2$ nanoparticles was about a half of that of the SBNO base material. It may be confirmed that although thermal conductivity decreases by using the RuO$_2$ nanoparticles, a considerably decrease in the Seebeck coefficient leads to a decrease in the figure of merit ZT.

As described above, the thermoelectric composite according to an embodiment may improve thermoelectric performance by improving electrical conductivity of a thermoelectric semiconductor material not combined with a conductive inorganic filler and increasing the Seebeck coefficient, while reducing thermal conductivity.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A thermoelectric composite comprising:
   a first layer including a thermoelectric semiconductor material,
   wherein the thermoelectric semiconductor material comprises a metal oxide having a layered crystal structure, wherein the metal oxide is represented by Formula 2:

$$A^{21}_{(2-m)}A^{22}_{m}M'_3O_{10} \qquad \text{Formula 2}$$

wherein in Formula 2, A$^{21}$ and A$^{22}$ each independently include Be, Mg, Ca, Sr, Ba, Ra, Pb, La, Ce, Pr, Sm, Eu, Gd, Tb, Dy, Ho, Er, Tm, Yb, Lu, or a combination thereof, wherein A$^{22}$ has a greater ionic radius than that of A$^{21}$, M' comprises Nb, V, Ta, Ti, Zr, Hf, W, Mo, Cr, Pb, Sn, or a combination thereof;
   $0<m\leq 1$ is satisfied; and
   a second layer comprising a conductive inorganic filler on a surface of the first layer, wherein the conductive inorganic filler comprises RuO$_2$,
   wherein the conductive inorganic filler comprises a nanosheet, and wherein the conductive inorganic filler comprises a different material than the thermoelectric semiconductor material,
   wherein the first layer and the second layer are stacked in a layered form,
   a third layer on the second layer and having a same composition as the first layer; and
   a fourth layer on the third layer and opposite the second layer, and having a same composition as the second layer.

2. The thermoelectric composite of claim 1, wherein the nanosheet has a thickness of about 1 nanometer to about 1,000 nanometers.

3. The thermoelectric composite of claim 1, wherein the metal oxide comprises Sr$_{(2-m)}$Ba$_m$Nb$_3$O$_{10}$ wherein $0<m\leq 1$.

4. The thermoelectric composite of claim 1, wherein a dimensionless figure of merit of the thermoelectric composite is in a range of about 0.001 to about 10.

5. The thermoelectric composite of claim 1, wherein a Seebeck coefficient of the thermoelectric composite is in a range of about 10 microvolts per kelvin to about 20000 microvolts per kelvin.

6. A thermoelectric element comprising the thermoelectric composite of claim 1.

7. A thermoelectric module comprising:
   a first electrode;
   a second electrode; and
   the thermoelectric element of claim 6 interposed between the first electrode and the second electrode.

8. A thermoelectric composite comprising:
   a first layer including a thermoelectric semiconductor material, wherein the thermoelectric semiconductor material comprises a metal oxide having a layered crystal structure, wherein the metal oxide is represented by Formula 2:

$$A^{21}_{(2-m)}A^{22}_{m}M'_3O_{10} \qquad \text{Formula 2}$$

wherein in Formula 2, A$^{21}$ and A$^{22}$ each independently include Be, Mg, Ca, Sr, Ba, Ra, Pb, La, Ce, Pr, Sm, Eu, Gd, Tb, Dy, Ho, Er, Tm, Yb, Lu, or a combination thereof, wherein A$^{22}$ has a greater ionic radius than that of A$^{21}$,
   M' comprises Nb, V, Ta, Ti, Zr, Hf, W, Mo, Cr, Pb, Sn, or a combination thereof, and
   $0<m\leq 1$ is satisfied;
   a second layer comprising a conductive inorganic filler on a surface of the first layer, wherein the conductive inorganic filler comprises RuO$_2$,
   a third layer on the second layer and having a same composition as the first layer; and
   a fourth layer on the third layer and opposite the second layer, and having a same composition as the second layer,
   wherein the first layer, the second layer, the third layer, and the fourth layer are stacked in a layered form.

* * * * *